(12) United States Patent
Lussier et al.

(10) Patent No.: US 9,921,263 B2
(45) Date of Patent: Mar. 20, 2018

(54) ELECTRONIC IDENTIFICATION SLAVE CONNECTOR

(71) Applicant: ZIOTA TECHNOLOGY INC., St-Hubert (CA)

(72) Inventors: Alain Lussier, Ogden (CA); Patrick Parenteau, Montréal (CA); Marc-Antoine Allain, Granby (CA)

(73) Assignee: ZIOTA TECHNOLOGY INC., St-Hubert, QC (CA)

( * ) Notice: Subject to any disclaimer, the term of this patent is extended or adjusted under 35 U.S.C. 154(b) by 668 days.

(21) Appl. No.: 14/230,988

(22) Filed: Mar. 31, 2014

(65) Prior Publication Data

US 2014/0292349 A1    Oct. 2, 2014

Related U.S. Application Data

(60) Provisional application No. 61/806,900, filed on Mar. 31, 2013.

(51) Int. Cl.
*G01R 31/02* (2006.01)
*H04B 3/46* (2015.01)
*G01R 31/28* (2006.01)

(52) U.S. Cl.
CPC ....... *G01R 31/2834* (2013.01); *G01R 31/021* (2013.01)

(58) Field of Classification Search
CPC .. G01R 31/021; G01R 31/025; G01R 31/026; G01R 31/04; G01R 31/041
USPC ........................ 324/539, 500, 537
See application file for complete search history.

(56) References Cited

U.S. PATENT DOCUMENTS

| | | | | |
|---|---|---|---|---|
| 4,307,928 A * | 12/1981 | Petlock, Jr. | ............ | H01R 11/18 324/754.16 |
| 4,316,259 A * | 2/1982 | Albrecht | .......... | G01R 31/31813 708/270 |
| 4,321,532 A * | 3/1982 | Luna | .................. | G01R 1/07328 324/72.5 |
| 4,567,756 A * | 2/1986 | Colborn | ............... | G01R 31/006 73/114.61 |
| 4,605,894 A * | 8/1986 | Cox | .................. | G01R 31/31924 324/537 |
| 4,689,551 A * | 8/1987 | Ryan | ..................... | G01R 31/022 324/539 |
| 4,959,792 A * | 9/1990 | Sullivan | ............... | G01R 31/021 324/555 |
| 5,675,257 A * | 10/1997 | Frus | ........................ | F02C 7/266 324/380 |

(Continued)

FOREIGN PATENT DOCUMENTS

WO    WO 2012083420 A    6/2012

*Primary Examiner* — Giovanni Astacio-Oquendo
(74) *Attorney, Agent, or Firm* — Benoit & Cote Inc.; C. Marc Benoit

(57) ABSTRACT

The present document describes a connector for use with a harness under test by an automated test equipment (ATE). The harness is electrically connected to a reference. The connector comprises connection points having a layout, namely a connector layout, electronic identifiers and a switch. Each one of the electronic identifiers is connected to a respective one of the connection points. The switch is either for connecting the ATE to the reference via the electronic identifiers, either for connecting the ATE to the reference while bypassing the electronic identifiers.

7 Claims, 2 Drawing Sheets

(56) References Cited

U.S. PATENT DOCUMENTS

| | | | | |
|---|---|---|---|---|
| 6,192,496 | B1* | 2/2001 | Lawrence | G01R 31/3191 |
| | | | | 324/73.1 |
| 6,910,924 | B1* | 6/2005 | Marion | H01R 13/2471 |
| | | | | 324/756.05 |
| 7,112,969 | B1* | 9/2006 | Thomas | G01R 31/041 |
| | | | | 324/503 |
| 7,248,035 | B2* | 7/2007 | Babcock | G01R 31/31924 |
| | | | | 324/73.1 |
| 7,728,605 | B2 | 6/2010 | Gervais | |
| 2002/0147561 | A1* | 10/2002 | Baracat | G01R 31/318307 |
| | | | | 702/119 |
| 2010/0312517 | A1* | 12/2010 | McNamara | G01R 31/2834 |
| | | | | 702/119 |
| 2011/0080187 | A1* | 4/2011 | Hotz | G01R 31/2889 |
| | | | | 324/756.02 |

* cited by examiner

ELECTRONIC IDENTIFICATION SLAVE CONNECTOR

CROSS-REFERENCE TO RELATED APPLICATIONS

This application claims priority of U.S. provisional patent application 61/806,900 filed Mar. 31, 2013, the specification of which is hereby incorporated herein by reference in its entirety.

BACKGROUND (a) Field

The subject matter disclosed generally relates to automated testing equipment for wire harnesses.

(b) Related Prior Art

Circuit analyzers are Automated Test Equipment (ATE) used to validate the configuration and integrity of new electrical circuits being built in a manufacturing environment but also for testing existing electrical circuits in a maintenance environment. For illustration purposes, an electrical circuit consists of a multitude of test points originating from a connector going through an electrical medium such as wires, connectors, passive components, all of such connections linking to other terminations at either another connection point in a connector or a ground connection.

Under the current state of art, these Automated Test equipment need to be connected to each and all of the connections points of the electrical circuit of the SUT in order to be able to validate the integrity of the configuration. This is how all of the test points in the electrical circuit of the system under test (SUT) are properly connected between them or a ground, and to validate the integrity such a circuit, that is that the connection is physically within specific electrical tolerances such as resistive value. These connections between the ATE and the SUT are generally performed with mating interface cable assemblies that are customized on one side with the ATE mating connector and on the other side the SUT mating connector. These interface cables requires a lot of preparation to make sure that they are built to specific configurations, a process which is time consuming, costly and can be somewhat bulky (i.e., big and a large quantity).

In addition to the interface mating cables, a specific test program generally has to be made to the specific configuration of the ATE and the SUT, a process which is also time-consuming and costly. There are however new techniques which were developed to reverse engineer the SUT, also called auto-configuration or auto-learning, which is a test program that has the ability to drive signals on specific connections points while "listening" to pick up such signal at all of the other interconnect points, to determine the interconnectivity of the electrical circuit of the SUT, and the ability to provide a report on a wire-to-wire and wire-to-ground interconnectivity of all connections points.

The present state-of-art therefore requires fully customized interface cables with an associated test program that has the ability to make a validation of the configuration and integrity of the electrical circuit of the SUT. Under the present state-of-art, the ATE will generate a signal, one at a time, to each and all connection points, and sequentially find any and all linked connections by having a method to capture transmitted signals, such as 'listening' for the emitted signal, or an indicative method such as a light or sound to measure the connection. Once all connections are detected and the circuit is validated, the ATE will have the ability to measure the resistive values of the connections by measuring the wire-to-wire or wire-to-ground.

One of the main limitations of the existing art is the complexity of testing specific electrical circuit when each individual SUT is different from others for example, in a manufacturing environment where each SUT is customized to unique configuration, or in a maintenance environment where testing of a specific electrical circuit may not be predictable in view of the uncertainty of a failure. In such cases, the complexity created by the large number and diversity of connectors that requires extensive preparation to configure each interface cable and test program, in addition to adding more testing points to the overall ATE to detect all possible interconnection permutations between them, is not efficient and too costly to make the process of using ATE economically viable.

There is therefore a need to develop a new method and apparatus to automate the creation of generic interface connectors and test programs to reduce the time and costs associated with such operations.

SUMMARY

The proposed ATE is used to validate the interconnection by interrogating from a source node each of the connection to detect and read electronic EEPROM that will provide termination mode identification. Other options will include 1) ability to switch off the memory to get a clear path to a ground for resistance, and 2) circuit to bypass the EEPROM memories and use the terminating connector as a PMO interface cable directly connected to the ATE.

According to an embodiment, there is provided a method to create generic mating interface cables that have the ability to connect to electronic slave connectors, a new generation of connectors that have an EEPROM connected to each of its connection points so that an ATE can unidirectionally send a signal to interrogate and read each of the memory devices to extract the information about the connector layout, and therefore identify the specific link connection, without having to have the terminating connections directly link to the ATE, and eliminating the need for specific test programs to use specific interface cables. In addition, such electronic slave connector will have the ability to connect to the ground so that the ATE can measure the resistive value of the terminating connection with an acceptable level of precision to validate the integrity of the connector.

In an aspect of the invention, there is provided a connector for use with a harness under test by an automated test equipment (ATE), the harness being electrically connected to a reference, the connector comprising: connection points having a layout, namely a connector layout; electronic identifiers, each one of the electronic identifiers being connected to a respective one of at least a portion of the connection points; a switch for one of: connecting the ATE to the reference via the electronic identifiers; and connecting the ATE to the reference while bypassing the electronic identifiers.

According to an embodiment, connecting the ATE to the reference via the electronic identifiers is for identifying a link connection between two terminating connections without having to have the terminating connections directly link to the ATE.

According to an embodiment, connecting the ATE to the reference while bypassing the electronic identifiers is for evaluating a quality of a link connection to a terminating connection.

According to an embodiment, the electronic identifier contains information for identifying a position of the connector.

According to an embodiment, the electronic identifier comprises a read-only memory.

According to an embodiment, the electronic identifier comprises an EEPROM.

According to an embodiment, the connector is adapted for connection with a standard interface cable, which is for connection to a second ATE.

According to an embodiment, the switch comprises one of: a manual switch, an electronic switch, a MEMS switch, a transistor, and a switch embedded in an electrical circuit board.

In another aspect of the invention, there is provided a method for testing a wire harness with an automated test equipment (ATE), the method comprising: sending a signal through a circuit comprising a wire; if an electronic identifier is present on the circuit, reading the electronic identifier; switching a switch on the circuit to connect the ATE to a reference while bypassing the electronic identifier; and sending a signal and measuring an electrical characteristic of the circuit for evaluating a quality of the circuit.

According to an embodiment, there is further provided, prior to switching, repeating sending a signal for a plurality of wires.

According to an embodiment, there is further provided, after switching, repeating sending a signal and measuring an electrical characteristic of the circuit for a plurality of wires.

According to an embodiment, there is further provided, after reading the electronic identifier, querying in a database about the identity of the electronic identifier.

According to an embodiment, there is further provided listing connections between terminations based on the identity of the electronic identifier of each wire.

According to an embodiment, measuring an electrical characteristic comprises measuring a resistance.

According to an embodiment, evaluating a quality of the circuit comprises comparing the resistance that is measured with a threshold to deduce the presence of defects on the circuit.

Present Mode of Operation ATEs validate continuity and identify specific interconnections (wire-wire, wire-ground) in an electrical circuit by sending a signal on a source node and having a 'detector' at the termination node.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Figure 1:
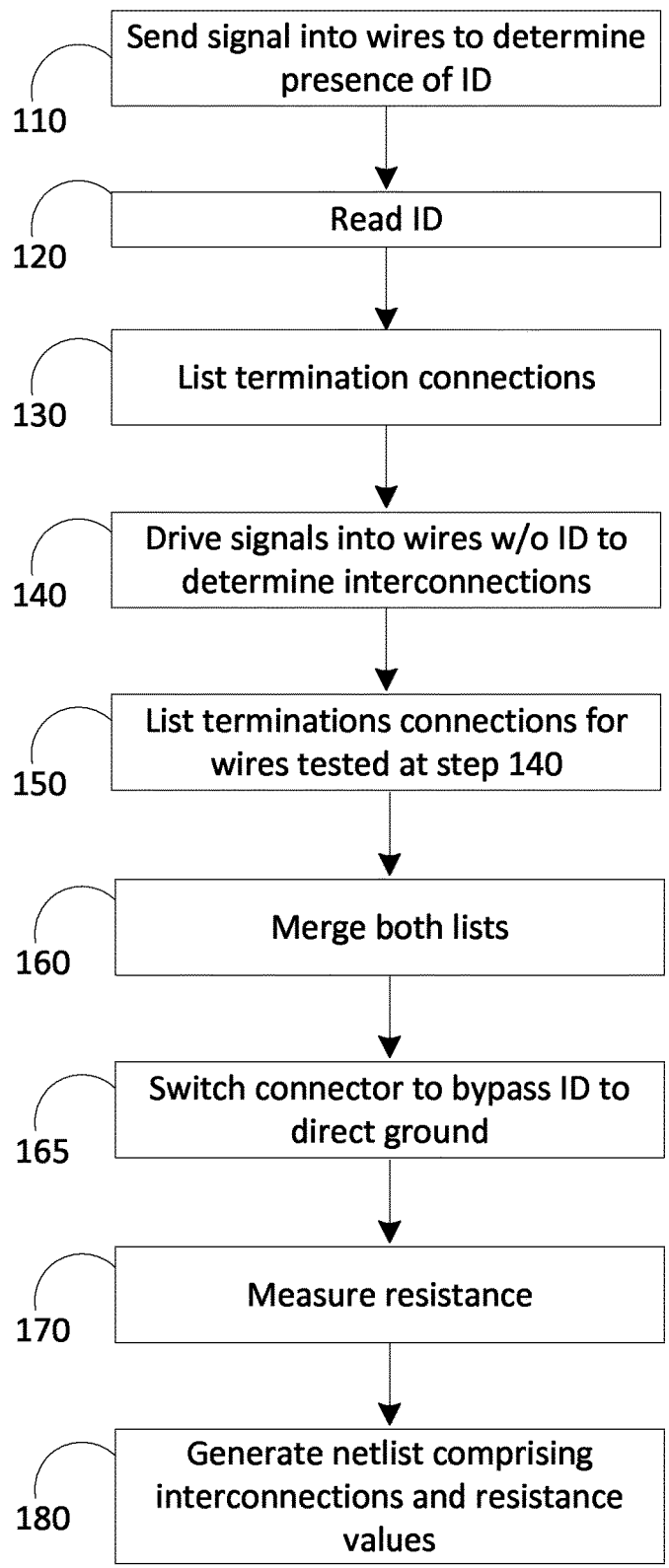
FIG. 1 is a flowchart illustrating the method for reading electronic identifiers and listing interconnections, according to an embodiment.

According to an embodiment, steps to build interface cables include:
1. Identify list of connector model on the SUT;
2. For each connector identified in 1, determine the opposite mating connector;
3. Determine of the mating connector in 2 is available on an existing interface cable in the inventory;
4. If none are found in 3, create a new interface cable;
5. Create an identification of the mating assembly so that it can be recognized by an ATE by any or a combination of the following methods:
    a. A standard number for the mating assembly;
    b. A unique serial number to the mating assembly;
    c. Incorporating a medium to read the information about the mating assembly;
        This identification method can be done manually or it can be created into a database;
6. Except if 5c was performed, the final mating assembly must be registered so that it can be recognized by the ATE in order to be able to use it on the SUT. It can be done manually or it can be created by a software in various ways, including:
    a. Adding the mating assembly to the ATE library the design layout of the mating assembly;
    b. Adding the mating assembly to a standard database;
7. Once recognizable by the ATE as described in step 9, the mating assembly can be shipped to the location where it is needed by the technician for the test/maintenance on the SUT, and at that point, it will generally need to be validated prior to the first utilization to make sure that it respects the specifications of connector on the SUT;
8. Another step generally required to operate the ATE is to use a test program that incorporates one or many interface mating cables and requires engineering or technician skills to ensure that the test signals sent to the SUT are appropriately sequenced on the specific connections points of any or all of the connectors;
9. The test program must also be identified in a matter similar to point 8;
10. The test program must also be delivered to the location of the test/maintenance and validated prior to its first utilization to ensure that it respects the specifications of the test requirements and that it was made by an approved entity listed in point 11;
11. The ATE can then perform the test by:
    a. Identifying each mating connector hooked to the ATE and related mate;
    b. Send test signals, one at a time to one originating connection and capture the signal by the receiver method on each of the terminating connections, repeating the operation to each of the connections as an originating connection until all connections have been tested;
    c. Merging the test results to create a netlist of connections;
    d. Make a resistance measurement of all of the connections;
    e. Create a report.

One driver of the embodiments described below is the ability for an ATE to detect and identify a link between 2 connection points of an electrical circuit with only one of the 2 connections, the originating node, being directly connected to the ATE by an interface cable, the terminating node being connected to an electronic slave connector that has embedded EEPROM (electrically erasable programmable read-only memory), the memory containing the layout characteristics and other information about the connector under test so that the link can be positively identified to a specific electrical node of the circuit.

It should be noted that even though embodiments described above use an EEPROM as an identifier for a connection point, the EEPROM can be replaced by other types of electrically-accessed memories. Non-volatile memories such as read-only memories or flash memories can be used as identifiers, as well as magnetic memories. Other identification means, such as circuit elements having very precise characteristics (such as a precise resistance or inductance) can be used as an identifier on a circuit. Many types of electronic identifiers are therefore suited for the identification of a connection point.

Figure 2:
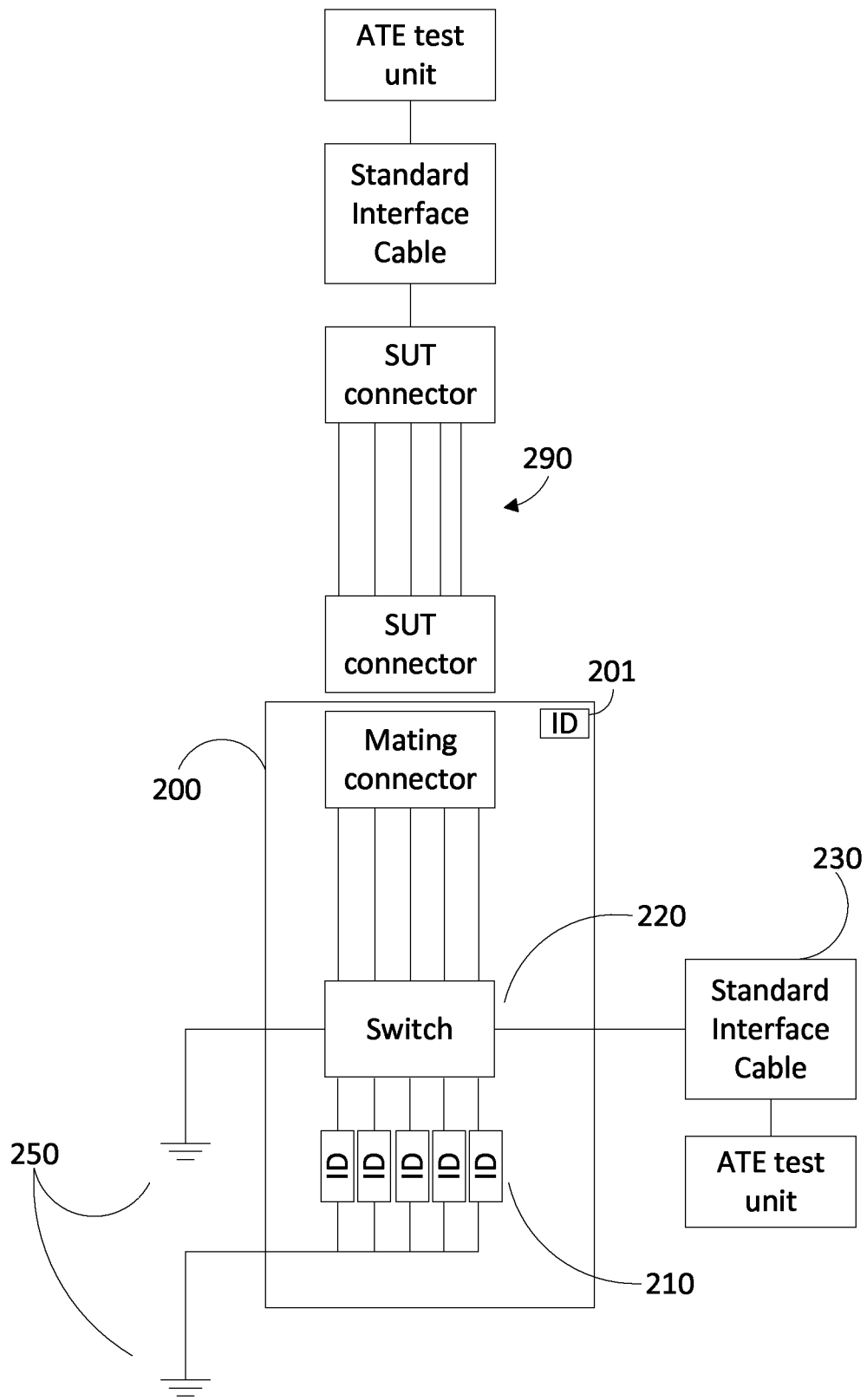
FIG. 2 is a block diagram showing the connector system, according to an embodiment.

Now referring to FIG. 1, the testing method can be described as follows:

First, the ATE will interrogate one by one each of the originating node, by sending a signal into the wire, to determine if a link can be made with an EEPROM (step 110);

Then, if a link can be made with an EEPROM, the ATE will read EEPROM and identify the link of the terminating connection (step 120), either by: reading the information of the termination connection on the EEPROM; or by retrieving the information associated with the EEPROM identification of the termination connection from a central database;

The ATE will compile a list of termination connections with an EEPROM list for merging into a netlist database (step 130);

The ATE will use conventional methods of driving signals to all originating connections who have been determined not to have a connection with the EEPROM list to determine other interconnections within the electrical circuit (step 140);

The ATE will compile a list of termination connections of the type wire-to-wire or wire-to-ground that have not an EEPROM on the circuit (step 150);

The ATE will merge the result obtained in steps 130 and 150 to create a final netlist configuration of the electrical circuit (step 160);

In the case in which there is a slave connector connection, the ATE will execute a command to remove the EEPROM from the circuit to make a direct connection to the ground (step 165). The ATE will proceed to read the resistive values of each node to determine quality of connection (step 170), by measuring resistance on a wire-to-wire or wire-to-to ground connection,;

ATE will merge the results in steps 160 and 170 to produce a final netlist configuration of the electrical circuit with resistive values of wire-to wire or wire-to ground connections (step 180);

According to an embodiment, the connector 200 for performing the method on a wire harness 290 can be described as follows, referring to FIG. 2.

The slave connector 200 has an EEPROM 210 for each connection point, or at least for each one of a portion of the connection points. The EEPROM has a unique ID and may contain any other information that can be used to identify the specific position of the slave connector contact layout. According to an embodiment, the slave connector 200 itself has an ID 201 so it can be identified prior to, during or after testing.

A switch 220 to provide the ability to connect the node to the EEPROM or to a direct ground 250, in the first case to identify the wire, and in the second case to be able to measure the resistive value to ground 250; this switch 220 may take the form of a manual or electronic switch (e.g. a transistor, a MEMS switch or the like), or be embedded in an electrical circuit board with other functions.

In other words, for a given wire linking two terminal connections of the wire harness 290, an ATE is placed at one of these terminal connections, and a slave connector is placed at the other one. For each one of the wires being tested, a signal is sent by the ATE into the circuit comprising the wire, and goes through an identifier (such as an EEPROM) to the electrical ground 250 (if no slave connected is provided at a given terminal connection, the conventional testing procedure applies). When the identifier is provided on the circuit, it allows extracting information therefrom, that can be used in a database to verify the identity or position of the connector. After this is done, a switch can bypass the identifier so that the ATE is directly linked to the electrical ground 250 (i.e. the signal does not go through the identifier). The resistance (or any other electrical characteristic) of the circuit can be measured. This measure allows evaluating the quality of the link between the two terminal connections, for example if there is a defect in the circuit by comparing resistance thresholds in a database, for example.

According to an embodiment, there is an option to connect all the wires of the slave connector to a generic mating interface cable 230, also known as a standard interface cable, that would have on one hand, a generic connector for the slave connector, and on the other hand, a connector to mate with the connector of another ATE. The option would permit the use of the slave connector as if it was a standard mating interface assembly to be used with such another ATE. This way, ATEs can be used in a conventional manner.

According to an embodiment, the slave connector 200 is not connected to the usual ground 250, but rather to another reference which differs from the ground 250 from a constant voltage or a known value. Generally speaking, the slave connector 200 is thus said to be electrically connected to a reference.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A method for testing a wire harness with an automated test equipment (ATE), the method comprising the steps, performed by the ATE, of:
    sending a signal through a circuit comprising a wire;
    if an electronic identifier, which is an electrically-accessed memory, is present on the circuit, reading the electronic identifier;
    switching a switch on the circuit to connect the ATE to a reference while bypassing the electronic identifier; and
    sending a signal and measuring an electrical characteristic of the circuit for evaluating a quality of the circuit.

2. The method of claim 1, further comprising, prior to switching, repeating sending a signal for a plurality of wires.

3. The method of claim 1, further comprising, after switching, repeating sending a signal and measuring an electrical characteristic of the circuit for a plurality of wires.

4. The method of claim 1, further comprising, after reading the electronic identifier, querying in a database about an identity of the electronic identifier.

5. The method of claim 4, further comprising listing connections between terminations based on the identity of the electronic identifier of each wire.

6. The method of claim 1, wherein measuring an electrical characteristic comprises measuring a resistance.

7. The method of claim 6, wherein evaluating a quality of the circuit comprises comparing the resistance that is measured with a threshold to deduce a presence of defects on the circuit.

\* \* \* \* \*